US008560981B2

(12) United States Patent
Sahouria

(10) Patent No.: US 8,560,981 B2
(45) Date of Patent: Oct. 15, 2013

(54) SEGMENTING INTEGRATED CIRCUIT LAYOUT DESIGN FILES USING SPECULATIVE PARSING

(75) Inventor: Emile Y. Sahouria, Sunnyvale, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 369 days.

(21) Appl. No.: 12/330,506

(22) Filed: Dec. 8, 2008

(65) Prior Publication Data

US 2009/0276747 A1 Nov. 5, 2009

Related U.S. Application Data

(60) Provisional application No. 61/012,341, filed on Dec. 7, 2007.

(51) Int. Cl.
*G06F 17/50* (2006.01)

(52) U.S. Cl.
USPC ........... 716/100; 716/101; 716/102; 716/110; 716/111; 703/13; 703/14

(58) Field of Classification Search
USPC ............... 716/100–107, 110–111; 703/13–14
See application file for complete search history.

(56) References Cited

U.S. PATENT DOCUMENTS 5,625,803 A * 4/1997 McNelly et al. ................ 703/14
5,692,160 A * 11/1997 Sarin .............................. 703/23
7,058,916 B2 * 6/2006 Phelps et al. ................. 716/104
7,504,645 B2 * 3/2009 Anpo et al. .............. 250/492.22
7,685,545 B2 * 3/2010 Chapman et al. ............ 716/136

* cited by examiner

*Primary Examiner* — Nghia Doan
(74) *Attorney, Agent, or Firm* — Mentor Graphics Corporation

(57) ABSTRACT

A method of parsing integrated circuit layout design data. According to some implementations, the segment boundaries are designated by first identifying data in the integrated circuit layout design data that matches a cell record start value. Next, the subsequent data is parsed, until a threshold amount of subsequent data has been parsed without identifying another cell record start value. When the threshold amount of subsequent data has been parsed without identifying another cell record start value, the next data in the integrated circuit layout design data matching a cell record start value is designated as a segment boundary. Integrated circuit layout design data can be segmented sequentially, or by using dyadic division. Once the integrated circuit layout design data has been broken up into segments, the segments can be provided to a parallel processing computing system for parsing in parallel.

20 Claims, 2 Drawing Sheets

START
201: IDENTIFY NEXT BYTE MATCHING CELL START BYTE VALUE
203: PARSE THE SUBSEQUENT PORTION OF THE INTEGRATED CIRCUIT LAYOUT DESIGN DATA
205: HAS PARSING STOPPED BEFORE NEXT CELL RECORD?
YES
NO
207: HAVE THRESHOLD VALUE M BYTES BEEN PARSED?
NO
YES
209: MAKE NEXT CELL RECORD START A SEGMENT BOUNDARY

SEGMENTING INTEGRATED CIRCUIT LAYOUT DESIGN FILES USING SPECULATIVE PARSING

RELATED APPLICATIONS

This application claims priority under 35 U.S.C. §119 to U.S. Provisional Patent Application No. 61/012,341, entitled "Segmenting Layout Files With Speculative Parsing," filed on Dec. 7, 2007, and naming Emile Y. Sahouria and Oleg Syrel as inventors, which application is incorporated entirely herein by reference.

FIELD OF THE INVENTION

The present invention is directed to the segmentation of integrated circuit layout design files into contiguous regions that may then be parsed in parallel. Various implementations of the invention may be particularly beneficial for segmenting integrated circuit layout design files in the Open Artwork System Interchange Standard (OASIS) data format or the Graphic Data System II (GDSII) data format.

BACKGROUND OF THE INVENTION

As known in the art, one of the most fundamental tasks for a conventional CAD tool configured to operate on integrated circuit (IC) layout design data is the creation of a layout database of some sort from a corresponding layout file on disk. When a layout design files are large, however, the time to read and parse the files can be a significant contribution to the time spent by the tool operating on the layout design.

BRIEF SUMMARY OF THE INVENTION

Aspects of the invention relate to the segmentation of integrated circuit layout design data. With various examples of the invention, wide disk arrays in a RAID configuration can offer high bandwidth and fast random access to layout design data stored on a disk. Independent segments of the layout design data can be provided to a parallel processing computing system, such as multi-CPU/multi-core computers for parsing in parallel.

With various examples of the invention, the start locations in the file for each parallel parsing task are determined. According to some implementations of the invention, this determination may be made automatically, without prior knowledge of the file contents, and with few assumptions regarding the structure of the file integrated circuit layout design data file. More particularly, with various embodiments of the invention, the starts of "cell" records within an integrated circuit layout design data file are estimated. The accuracy of each estimate is validated by attempting to parse the file from that location. The validated cell start locations then are designated as the segment boundaries.

DETAILED DESCRIPTION OF THE INVENTION

A conventional integrated circuit layout design data file, such as a file of integrated circuit layout design data in the OASIS file format, comprises many byte sequences (typically referred to as "records"). Each record has a type, indicated by the first byte in the sequence. Further, a record may be nested inside one or more other records. The format specification defines the structure of records, and restricts their composition by nesting and concatenation.

In particular, a conventional integrated circuit layout design data file will include "start" and "cell" records. The start record appears first in the file, and has a short, easily determined length. As previously noted, the remainder of the file contains a sequence of a few types of potentially composite records. Chief among these are the cell records, which define the recursive geometrical containers in the layout design. Each cell contains shapes and "placements" of other cells. A placement is an instantiation of a cell in another cell (the "parent") with a particular affine transform in the coordinate system of the parent. The cell and other records that appear in the file and are not nested inside any other record are called "top level" records.

The top level records may be parsed independently of the rest of the file. Further, the correctness of these records in the context of the whole file may be determined with an amount of access to common data structures that is very small relative to the typical work of parsing the cell. Taking advantage of these two facts, various implementations of the invention employ a segmentation scheme that detects segment boundaries at the start bytes of top level records in the file. More particularly, various embodiments of the invention employ cell records to segment an integrated circuit layout design data file, although, as will be appreciated by those of ordinary skill in the art, still other embodiments of the inventions may employ other types of records to segment integrated circuit layout design data files. As will be discussed in more detail below, according to various implementations of the invention, each segment will be contiguous and contain bytes, and thus all top-level records, up to the next segment boundary. The segments may be parsed in parallel with only a small amount of shared, synchronized access to common data structures. The desired sizes of the segments can be chosen under some cost-benefit model to minimize total parsing time.

Figure 1:
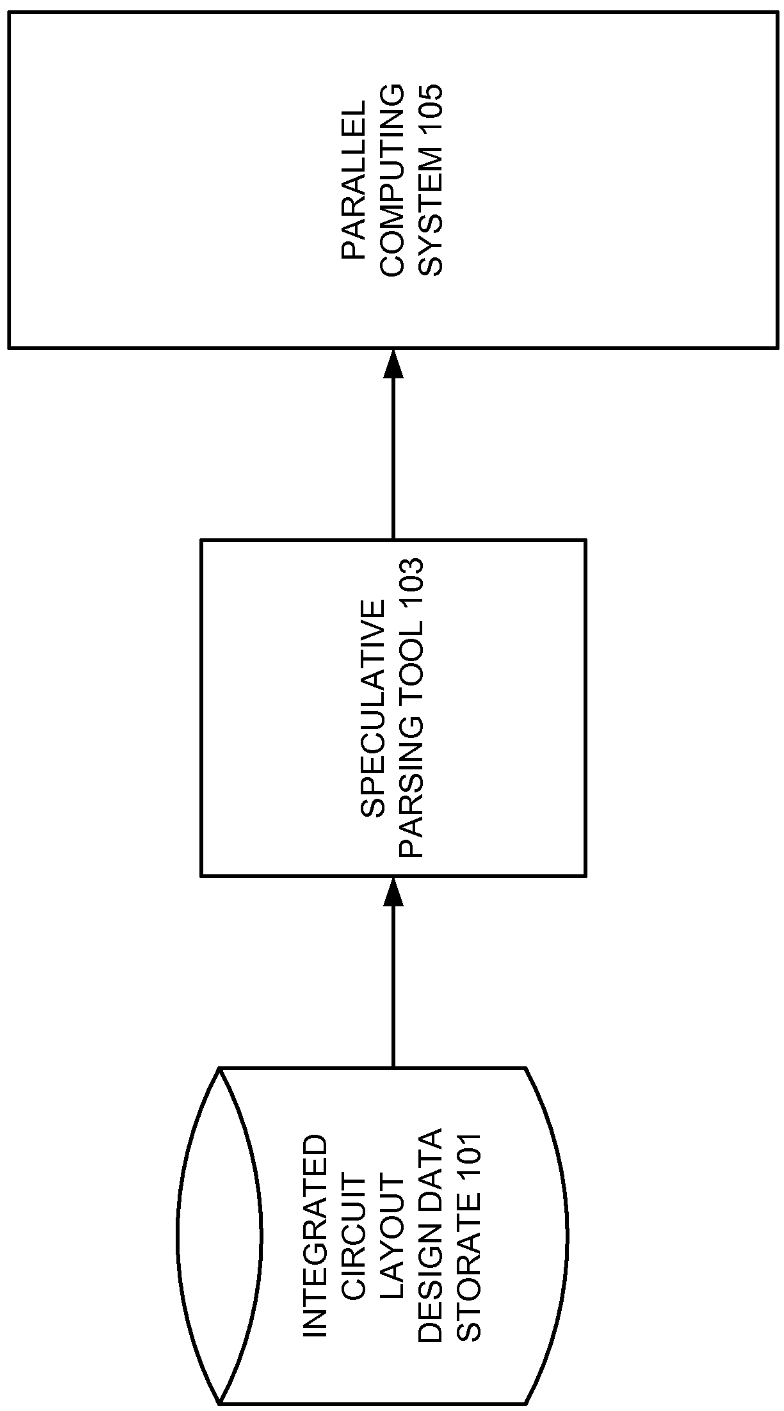
FIG. 1 illustrates a parsing system for implanting a speculative parsing operation that may be employed according to various embodiments of the invention.
Figure 2:
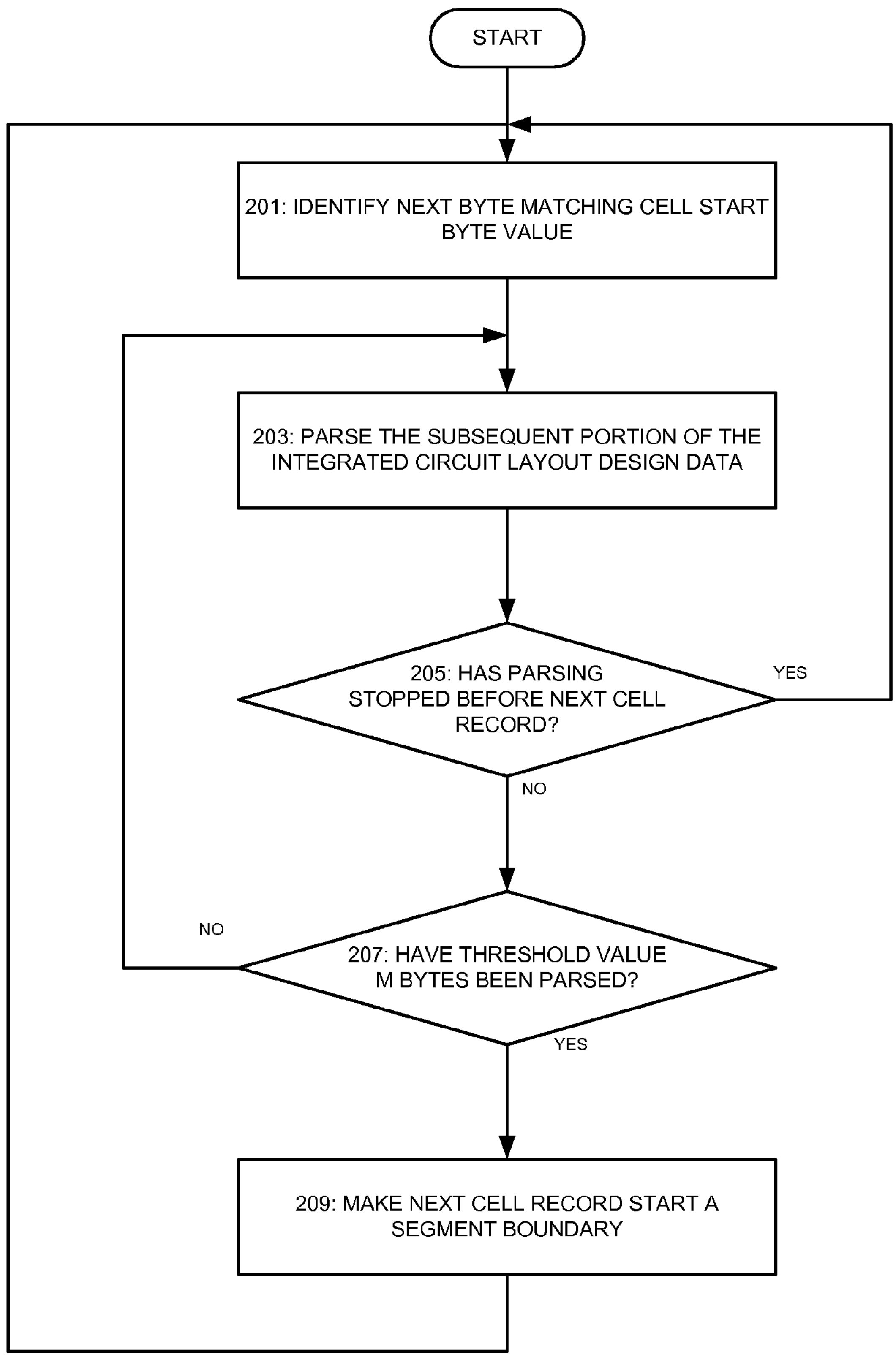
FIG. 2 illustrates a flowchart describing a speculative parsing operation process that may be employed according to various embodiments of the invention.

FIG. 1 illustrates a parsing system for implanting a speculative parsing operation that may be employed according to various embodiments of the invention. The parsing system includes an integrated circuit layout design data storage 101, a speculative parsing tool 103 according to various embodiments of the invention, and a parallel computing system 105. As will be discussed in more detail below, the speculative parsing tool 103 segments integrated circuit layout design data stored in the integrated circuit layout design data storage 101, and provides the segments to the parallel computing system 105 for parallel parsing. Various implementations of the speculative parsing tool 103 may employ the speculative parsing operation process illustrated in the flowchart illustrated in FIG. 2, which will now be discussed in detail.

Because a file may be parsed correctly from a cell record start, as previously noted, in operation 201 the speculative parsing tool 103 searches for a byte in the integrated circuit layout design data file that matches the value of a cell record start byte. Then, in operation 203, the speculative parsing tool 103 attempts to validate that the selected byte is an actual cell start byte by beginning to parse the subsequent portion of the integrated circuit layout design data from that point forward. Essentially, the probability that the chosen byte was not an actual cell start byte drops rapidly as more bytes are processed.

In practice, the speculative parsing tool 103 must encounter another cell start record for this more general statement to be true. The reason is that the nested records inside a cell may also sometimes be parsed correctly from an arbitrary point inside a cell. If the few bytes before that point have values that coincidentally mimic a cell record start, they could be recognized as a false start if parsing stopped before reaching the next cell record in operation 205. However, for the next cell record start to be invalid, the entire sequence of bytes from the first hypothesized start to the next detected start would have to be wrong in the context of the whole file, while still being a correct sequence in isolation.

With various embodiments of the invention, the speculative parsing tool 103 will continue to parse subsequent bytes until a threshold value of at least M bytes have been parsed. If M number of subsequent bytes are successfully parsed in operation 207, then in operation 209 the speculative parsing tool 103 will make the next cell record start a segment boundary. For a typical value of M of 32768 ($2^{15}$), the probability of a false cell start detection is vanishingly small. One can approximate this probability with a simple model. Given that the parser has correctly processed a byte in the file, the next byte is constrained by the format to have only a few acceptable values. Each byte, of eight binary bits, has 256 values. Suppose that even a few of these are prohibited by the format specification for each byte given the previous byte. Then using the chain rule for conditional probability, the probability that a sequence of bytes is correct in isolation but wrong in context is <=pm, with p the maximum possible fraction of possible values for the cur-rent byte given the previous one. This number approaches zero exponentially fast for any p<1. While this model is not exact because the byte restriction may depend on more than the previous byte, the next several bytes may depend on the past byte history, and for some fraction of bytes there may be no restriction, this model can be employed to determine a suitable threshold value M.

Various implementations of the invention may further employ this operation process recursively to segment a layout file using dyadic division. With these implementations, given a segment determined from a previous iteration, the speculative parsing tool 103 can break the segment approximately in half by detecting a segment boundary near the middle. This recursive operation can be stopped once the segment size is small enough, or when detection fails.

These speculation parsing operation processes according to various embodiments of the invention can fail in two ways, each of which is detectable, correctable, and rare. First, a segment boundary may be wrong (with some very small probability). If this occurs, the subsequent parsing of that or an adjacent segment will fail. Second, the speculative parsing tool 103 may fail to detect a segment boundary early in the dyadic division (e.g., the first search started inside an unusually long cell record), in which case too few segments are produced. In either case, the speculative parsing tool 103 can simply revert to a sequential parsing. Since these failures are extremely rare, the gain realized in all other cases easily justifies the algorithm. Note that a format error in the file is not distinguishable from a segment detection error, but this case should also be exceedingly rare in practice, and will entail much more wasted time than an extra parsing attempt.

This "speculative" parsing operation process has very good complexity. If a user limits the number of hypothesized start points for each boundary detection, the boundary detection step has fixed computational complexity that is small compared to the typical (1 GB) segment size. The number of these steps is O(n log n), with n the number of segment produced. With n segments, the processing gain from parallel parsing is also about equal to the number of CPUs used, say c. Then a user can even adjust the parameters of the segment boundary detection to limit the work as a fraction of the total real parsing time. In practice, a wide range of parameters work well, and the algorithm provides a huge processing gain by enabling parallel parsing.

Conclusion

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

What is claimed is:

1. A method of parsing integrated circuit layout design data, comprising:

(a) employing a computer to identify data in integrated circuit layout design data matching a cell record start value;

(b) employing the computer to parse data in the integrated circuit layout design data subsequent to the identified data, until a threshold amount of subsequent data has been parsed without identifying another cell record start value; and (c) when the threshold amount of circuit layout design data subsequent to the identified data has been parsed without identifying another cell record start value, having the computer designate the next data in the integrated circuit layout design data matching a cell record start value as a segment boundary;

(d) repeating steps (a)-(c) until the integrated circuit layout design data has been divided into segments by segment boundaries; and (e) providing the segments to a parallel processing computing system for parsing in parallel.

2. The method recited in claim 1, wherein the threshold value is $2^{15}$ bytes.

3. The method recited in claim 1, wherein the integrated circuit layout design data is in the Open Artwork System Interchange Standard (OASIS) data format or the Graphic Data System II (GDSII) data format.

4. The method recited in claim 1, wherein desired sizes of the segments are chosen to reduce total parsing time.

5. A method, comprising:

(a) selecting a segment of data in integrated circuit layout design data;

(b) from a location before a middle of the identified segment, employing a computer to identify data in the segment matching a cell record start value;

(c) employing the computer to parse data in the integrated circuit layout design data subsequent to the identified data, until a threshold amount of subsequent data has been parsed without identifying another cell record start value; and (e) when the threshold amount of circuit layout design data subsequent to the identified data has been parsed without identifying another cell record start value, employing the computer to designate the next data in the integrated circuit layout design data matching a cell record start value as a segment boundary dividing the selected segment into two smaller segments;

(f) repeating steps (a)-(e); and (g) providing the segments to a parallel processing computing system for parsing in parallel.

6. The method recited in claim 5, wherein the threshold value is $2^{15}$ bytes.

7. The method recited in claim 5, wherein the integrated circuit layout design data is in the Open Artwork System Interchange Standard (OASIS) data format or the Graphic Data System II (GDSII) data format.

8. The method recited in claim 5, wherein steps (a)-(e) are repeated until the segments are below a desired size.

9. The method recited in claim 5, steps (a)-(e) are repeated until the segments cannot be divided into smaller segments.

10. The method recited in claim 5, steps (a)-(e) are repeated until each segment is below a desired size or cannot be divided into smaller segments.

11. A computer-readable storage device storing computer executable instructions for causing a computer to perform the method of parsing integrated circuit layout design data, comprising:

(a) identifying data in integrated circuit layout design data matching a cell record start value;

(b) parsing data in the integrated circuit layout design data subsequent to the identified data, until a threshold amount of subsequent data has been parsed without identifying another cell record start value; and (c) when the threshold amount of circuit layout design data subsequent to the identified data has been parsed without identifying another cell record start value, designating the next data in the integrated circuit layout design data matching a cell record start value as a segment boundary;

(d) repeating steps (a)-(c) until the integrated circuit layout design data has been divided into segments by segment boundaries; and (e) providing the segments to a parallel processing computing system for parsing in parallel.

12. The computer-readable storage device recited in claim 11, further comprising instructions making the threshold value $2^{15}$ bytes.

13. The computer-readable storage device recited in claim 11, wherein the integrated circuit layout design data is in the Open Artwork System Interchange Standard (OASIS) data format or the Graphic Data System II (GDSII) data format.

14. The computer-readable storage device recited in claim 11, further comprising instructions choosing desired sizes of the segments to reduce total parsing time.

15. A computer-readable storage device storing computer executable instructions for causing a computer to perform a method comprising:

(a) selecting a segment of data in integrated circuit layout design data;

(b) from a location before a middle of the identified segment, identifying data in the segment matching a cell record start value;

(c) parsing data in the integrated circuit layout design data subsequent to the identified data, until a threshold amount of subsequent data has been parsed without identifying another cell record start value; and (e) when the threshold amount of circuit layout design data subsequent to the identified data has been parsed without identifying another cell record start value, employing the computer to designate the next data in the integrated circuit layout design data matching a cell record start value as a segment boundary dividing the selected segment into two smaller segments;

(f) repeating steps (a)-(e); and (g) providing the segments to a parallel processing computing system for parsing in parallel.

16. The computer-readable storage device recited in claim 15, further comprising instructions making the threshold value $2^{15}$ bytes.

17. The computer-readable storage device recited in claim 15, wherein the integrated circuit layout design data is in the Open Artwork System Interchange Standard (OASIS) data format or the Graphic Data System II (GDSII) data format.

18. The computer-readable storage device recited in claim 15, further comprising instructions for repeating steps (a)-(e) until the segments are below a desired size.

19. The computer-readable storage device recited in claim 15, further comprising instructions for repeating steps (a)-(e) until the segments cannot be divided into smaller segments.

20. The computer-readable storage device recited in claim 15, further comprising instructions for repeating steps (a)-(e) until each segment is below a desired size or cannot be divided into smaller segments.

* * * * *